United States Patent
Kurasawa

(10) Patent No.: US 8,101,869 B2
(45) Date of Patent: Jan. 24, 2012

(54) MOUNTING STRUCTURE, ELECTRO-OPTICAL DEVICE, AND ELECTRONIC APPARATUS

(75) Inventor: Munenori Kurasawa, Chino (JP)

(73) Assignee: Sony Corporation, Tokyo (JP)

(*) Notice: Subject to any disclaimer, the term of this patent is extended or adjusted under 35 U.S.C. 154(b) by 816 days.

(21) Appl. No.: 11/837,418

(22) Filed: Aug. 10, 2007

(65) Prior Publication Data

US 2008/0074830 A1 Mar. 27, 2008

(30) Foreign Application Priority Data

Sep. 25, 2006 (JP) ................... 2006-258779

(51) Int. Cl.
*H05K 1/16* (2006.01)
(52) U.S. Cl. ...................... 174/260; 361/760
(58) Field of Classification Search .......... 174/254, 174/260, 262; 361/681, 760, 803; 439/65, 439/74; 349/149, 150
See application file for complete search history.

(56) References Cited

U.S. PATENT DOCUMENTS

| | | | | |
|---|---|---|---|---|
| 5,737,053 A | * | 4/1998 | Yomogihara et al. | 349/149 |
| 5,767,571 A | * | 6/1998 | Kimura et al. | 257/668 |
| 5,982,468 A | * | 11/1999 | Satou et al. | 349/150 |
| 7,012,667 B2 | * | 3/2006 | Pai | 349/152 |
| 2005/0224561 A1 | * | 10/2005 | Kurasawa et al. | 228/180.22 |
| 2006/0109394 A1 | * | 5/2006 | Miyagawa et al. | 349/58 |

FOREIGN PATENT DOCUMENTS

| | | | |
|---|---|---|---|
| JP | 03-250535 A | | 11/1991 |
| JP | 03-265186 A | | 11/1991 |
| JP | 05021515 A | * | 1/1992 |
| JP | 04-188740 A | | 7/1992 |
| JP | 11-317575 A | | 11/1999 |
| JP | 2000-357854 A | | 12/2000 |

* cited by examiner

*Primary Examiner* — Yuriy Semenenko
(74) *Attorney, Agent, or Firm* — K&L Gates LLP

(57) ABSTRACT

A mounting structure includes a member to be bonded, a flexible base, a reinforcing portion, and a bonding member. The flexible base includes a plurality of first leads. The reinforcing portion is arranged between an edge of the flexible base and an outer lead of the plurality of first leads and has a width larger than that of the outer lead. The bonding member bonds the member to be bonded and the flexible base together.

11 Claims, 6 Drawing Sheets

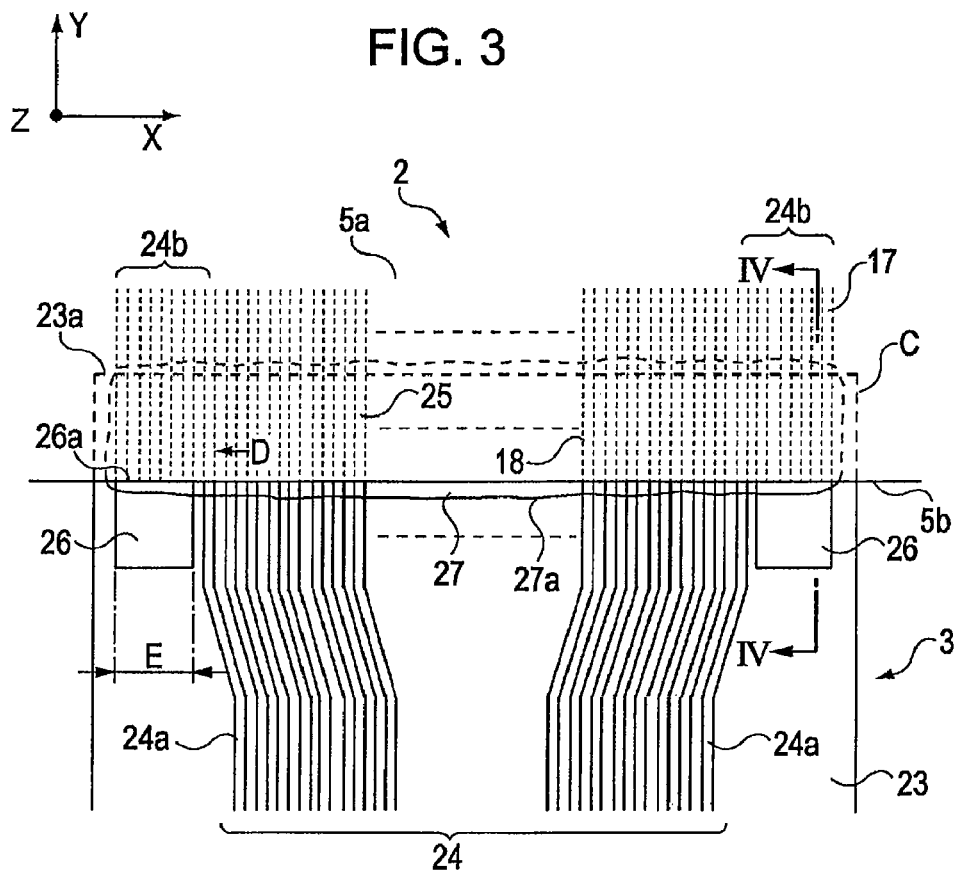
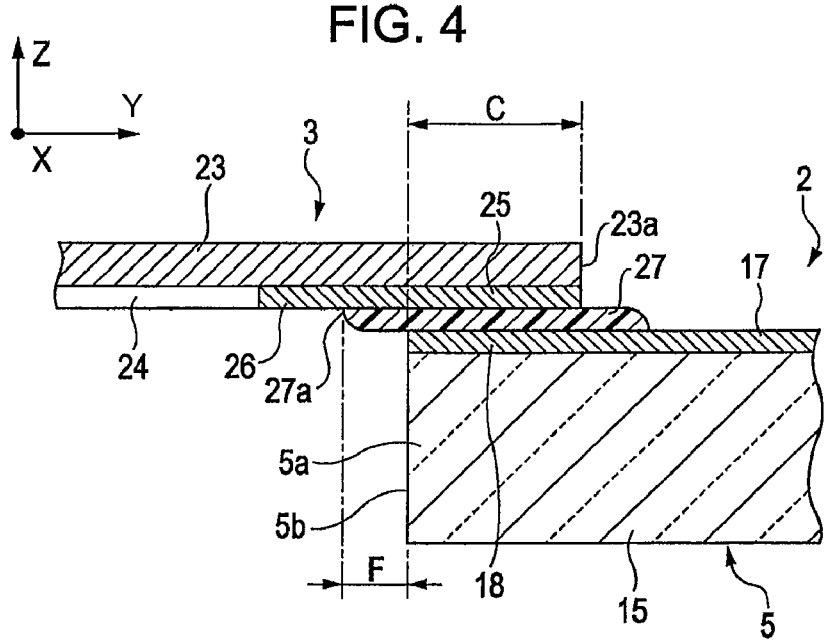

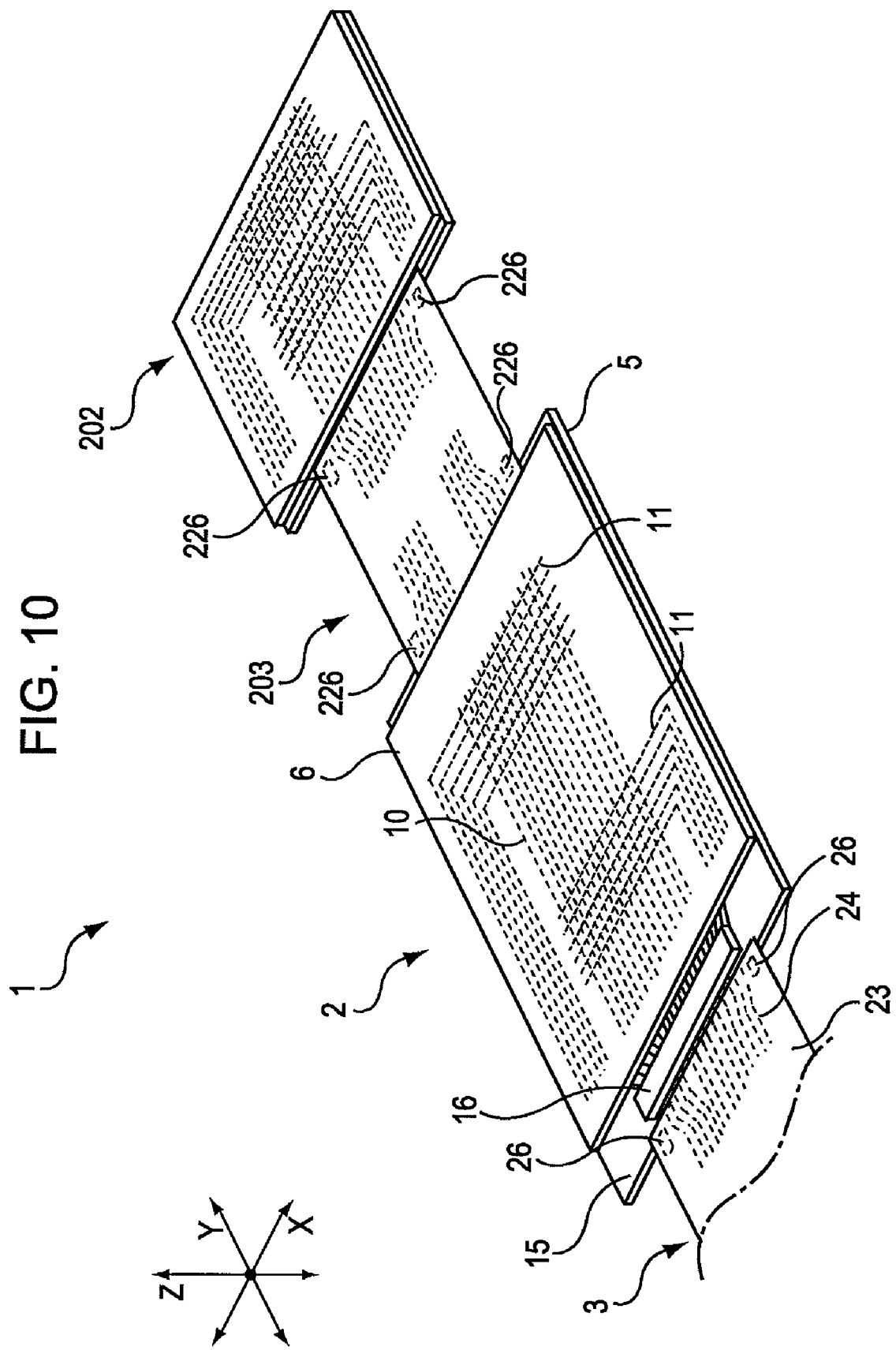

MOUNTING STRUCTURE, ELECTRO-OPTICAL DEVICE, AND ELECTRONIC APPARATUS

The entire disclosure of Japanese Patent Application No. 2006-258779, filed Sep. 25, 2006 is expressly incorporated by reference herein.

BACKGROUND

1. Technical Field

The present invention relates to a mounting structure for use in a personal computer, a cellular phone, and other apparatuses, to an electro-optical device using the mounting structure, and to an electronic apparatus using the electro-optical device.

2. Related Art

An electro-optical device, such as a liquid crystal device, used as a display device in an electronic apparatus (e.g., a personal computer or a cellular phone) is known. In the liquid crystal device, electronic components, such as semiconductor elements, can be mounted by tape automated bonding (TAB).

However, with TAB, poor connection between leads (terminals) of electronic components and electrically connected leads (terminals) tends to occur because of a break occurring in the leads.

One approach to addressing this problem is to form a mounting structure for mounting a semiconductor element on a lead frame such that, among outer leads in the semiconductor element, at least leads at both ends of each side have a width larger than the width of other outer leads (see, for example, JP-A-4-188740, in particular, at lines 6 through 3 from the bottom of the upper right column on page 2 and FIG. 1).

Although this technique can reduce a stress on leads in a semiconductor element bonded by TAB and facilitate prevention of a break occurring in the leads, when a flexible substrate is connected to, for example, an electro-optical panel by TAB, depending on a pressure on leads (terminals) at connections, different connection conditions may cause partial poor connection at each connection.

SUMMARY

An advantage of some aspects of the invention is that it provides a mounting structure that can ensure reliability of connection of leads between a member to be bonded and a flexible base, can reduce a break occurring in the leads, and thus can improve electrical reliability and also provides an electro-optical device using the mounting structure and an electronic apparatus using the electro-optical device.

According to a first aspect of the invention, a mounting structure includes a member to be bonded, a flexible base, a reinforcing portion, and a bonding member. The flexible base includes a plurality of first leads. The reinforcing portion is arranged between an edge of the flexible base and an outer lead of the plurality of first leads and has a width larger than that of the outer lead. The bonding member bonds the member to be bonded and the flexible base together.

An example of the "member to be bonded" is an electronic component, such as a semiconductor element or a glass substrate of a liquid crystal panel. Examples of the "first leads" include a terminal for connection and a lead connected to the terminal.

Since the mounting structure according to the first aspect includes the reinforcing portion disposed between the edge of the flexible base and the outer lead of the plurality of first leads and having a width larger than the width of the outer lead, the leads can withstand a stress caused by, for example, the flexible base being bent with respect to the bonded member. This can improve electrical reliability of the mounting structure.

In accordance with the first aspect of the invention, the member to be bonded may include a plurality of second leads electrically connected to the plurality of first leads in a region overlapping the flexible base, and the reinforcing portion may be provided with a dummy lead extending therefrom, the dummy lead being electrically connected to the second leads. Examples of the "second leads" include a terminal for connection and a lead connected to the terminal. The reinforcing portion with the dummy lead can reduce a crack occurring in the leads resulting from a stress caused by, for example, the flexible base being bent.

In accordance with the first aspect of the invention, a first side of the reinforcing portion may be substantially in contact with a first side of the bonded member in plan view, the first side of the reinforcing portion being adjacent to the bonded member, the first side of the bonded member being adjacent to the flexible base.

In accordance with the first aspect of the invention, the reinforcing portion may be disposed on each of both side portions of the flexible base. Therefore, even when the both side portions are subjected to a stress caused by, for example, bending, a break occurring in the first leads can be reliably reduced. This can improve electrical reliability of the mounting structure.

In accordance with the first aspect of the invention, at least a section of the bonding member may be disposed on the reinforcing portion. Examples of the "bonding member" include an anisotropic conductive film (ACF), a non-conductive paste (NCP), and a non-conductive film (NCF).

According to a technique of the related art using an ACF to perform thermocompression, a cured resin having leaked out of the overlapping region may cause the flexible base to be subjected to a severe stress during bonding due to a difference in hardness. The severe stress may cause a crack being formed in the stressed area, thus resulting in a break in the leads.

In contrast, according to the invention, since at least a section of the bonding member is disposed on the reinforcing portion, a portion subjected to the highest stress can be efficiently strengthened. As a result, electrical reliability of the mounting structure can be still further improved.

According to a second aspect of the invention, an electro-optical device includes an electro-optical panel, a flexible base, a reinforcing portion, and a bonding member. The electro-optical panel includes a first base and a second base holding an electro-optical material therebetween. The flexible base includes a plurality of first leads. The reinforcing portion is arranged between an edge of the flexible base and an outer lead of the plurality of first leads and has a width larger than that of the outer lead. The bonding member bonds the first base and the flexible base together.

Since the electro-optical device according to the second aspect includes the reinforcing portion disposed between the edge of the flexible base and the outer lead of the plurality of first leads and having a width larger than the width of the outer lead, the leads can withstand a stress caused by, for example, the flexible base being bent with respect to the bonded member. This can improve electrical reliability of the electro-optical device.

In accordance with the second aspect, the first base may include a plurality of second leads electrically connected to the plurality of first leads in a region overlapping the flexible base, and the reinforcing portion may be provided with a dummy lead extending therefrom, the dummy lead being electrically connected to the second leads. The reinforcing portion with the dummy lead can reduce a crack occurring in the leads resulting from a stress caused by, for example, the flexible base being bent.

In accordance with the second aspect, a first side of the reinforcing portion may be substantially in contact with a first side of the first base in plan view, the first side of the reinforcing portion being adjacent to the first base, the first side of the first base being adjacent to the flexible base. Therefore, even if the amount of a protruded portion of the bonding member is small, the bonding member can be reliably disposed on the reinforcing portion. As a result, a break occurring in the leads caused by a stress occurring in the bonding member can be reliably reduced.

According to a third aspect of the invention, an electronic apparatus includes the electro-optical device described above.

Since an electronic apparatus according to an aspect of the invention includes an electro-optical device that can ensure reliability of connection of leads between a first base and a flexible base and also reduce a break occurring in the leads on the flexible base, electrical reliability of the electronic apparatus can be further improved.

BRIEF DESCRIPTION OF THE DRAWINGS

The invention will be described with reference to the accompanying drawings, wherein like numbers reference like elements.

FIG. 3 illustrates leads in an overlapping region and its adjacent areas.

FIG. 4 is a cross-sectional view taken along the line IV-IV of FIG. 3.

FIG. 10 is a schematic perspective view of a flexible substrate that connects two liquid crystal panels.

DESCRIPTION OF EXEMPLARY EMBODIMENTS

Figure 1:
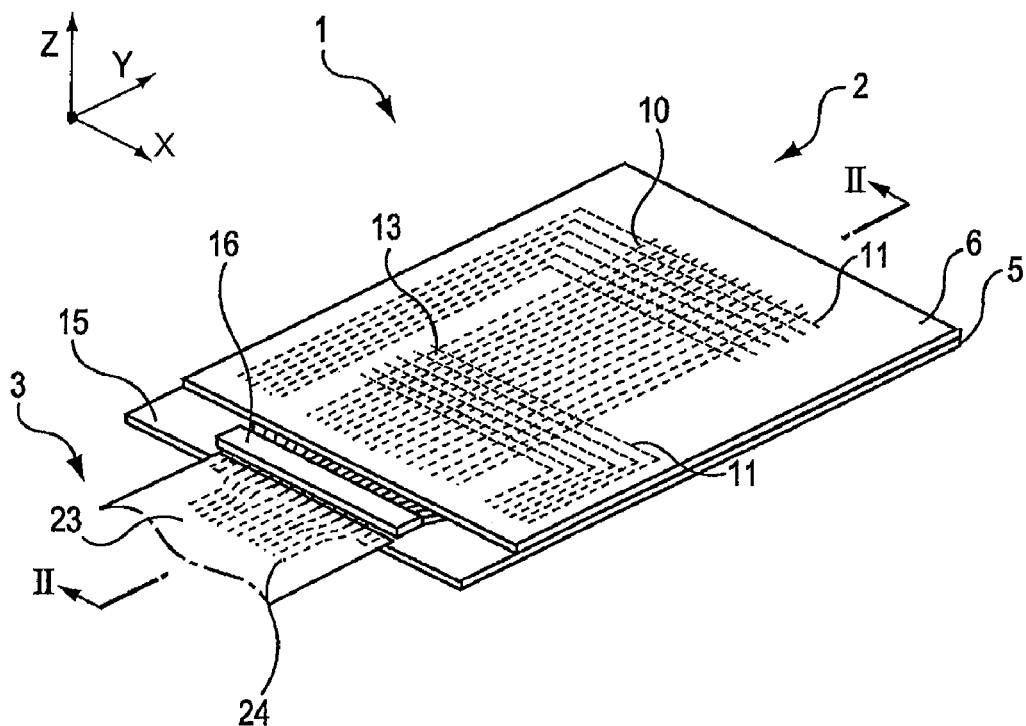
FIG. 1 is a schematic perspective view of a liquid crystal device according to a first embodiment.

Embodiments of the invention are described below with reference to the drawings. In the following embodiments, a thin film transistor (TFT) active matrix liquid crystal device is used as an example of a mounting structure and an electro-optical device, and an electronic apparatus including this device is described. However, the invention is not limited to this type. For the sake of clarity, the scale and the number of elements illustrated in the drawings are different from those in the actual structure.

First Embodiment

Figure 2:
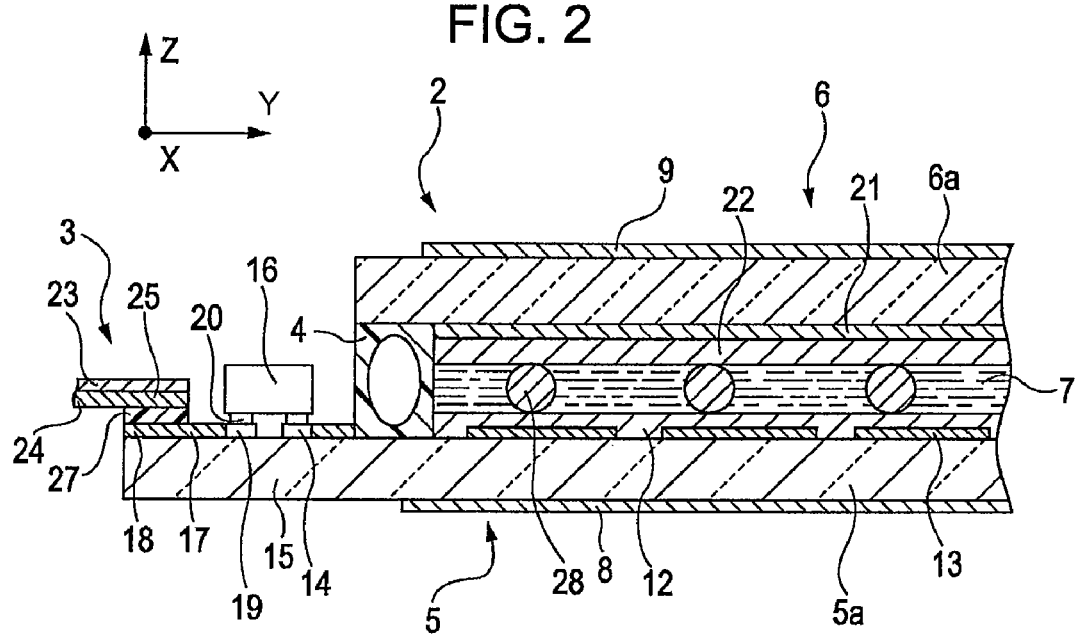
FIG. 2 is a cross-sectional view taken along the line II-II of FIG. 1 (the inside of a driver IC is not illustrated).
Figure 5:
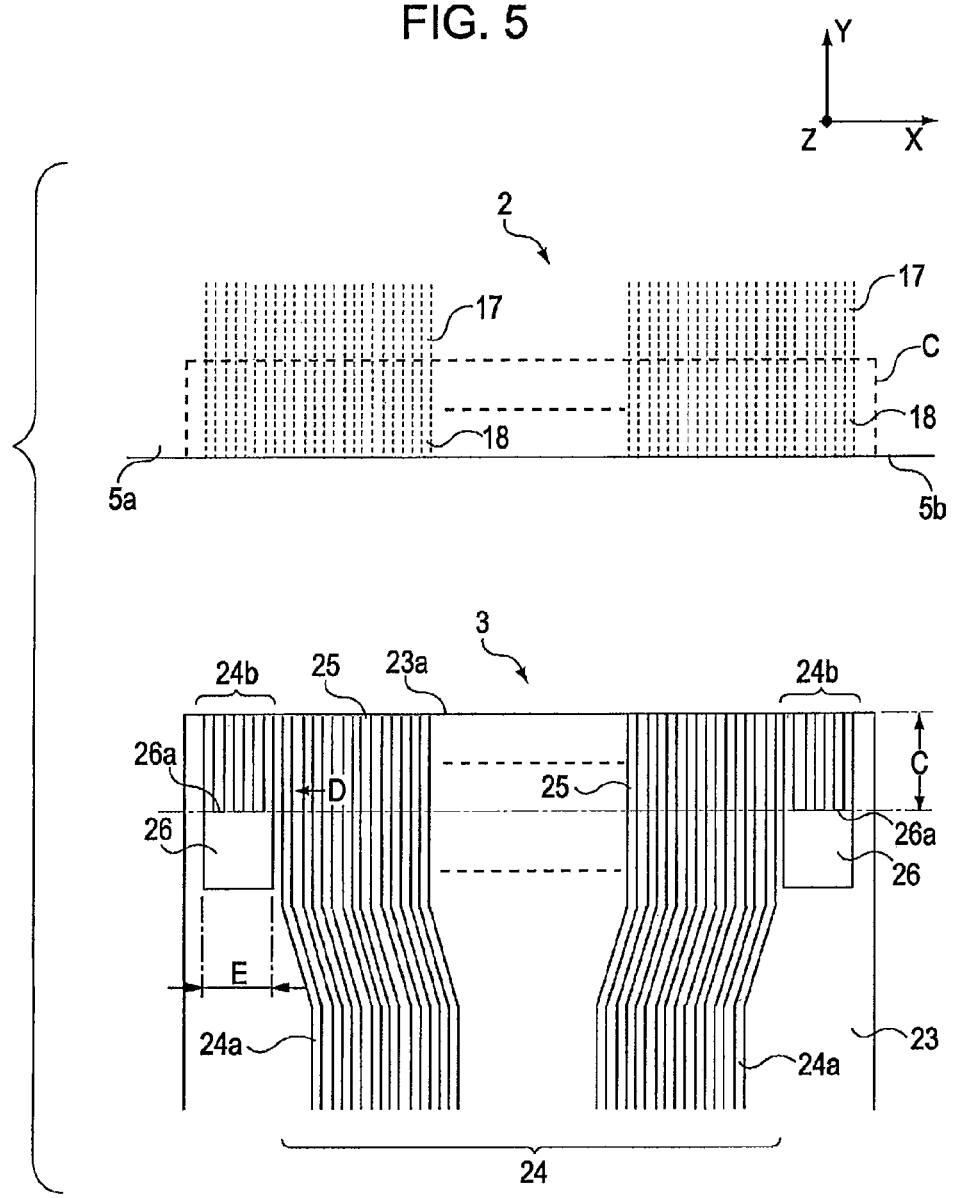
FIG. 5 illustrates the overlapping region illustrated in FIG. 3 before bonding.

FIG. 1 is a schematic perspective view of a liquid crystal device according to a first embodiment. FIG. 2 is a cross-sectional view taken along the line II-II of FIG. 1 (the inside of a driver IC is not illustrated). FIG. 3 illustrates leads in an overlapping region and its adjacent areas. FIG. 4 is a cross-sectional view taken along the line IV-IV of FIG. 3. FIG. 5 illustrates the overlapping region illustrated in FIG. 3 before bonding.

Structure of Liquid Crystal Device

As illustrated in FIG. 1, a liquid crystal device 1 can include a liquid crystal panel 2 and a flexible substrate 3 electrically connected to the liquid crystal panel 2. The liquid crystal device 1 may include an illumination unit (e.g., a backlight) and other ancillary equipment (not shown) if needed, in addition to the flexible substrate 3.

As illustrated in FIGS. 1 and 2, the liquid crystal panel 2 includes a first substrate 5, a second substrate 6, and twisted nematic (TN) liquid crystals 7 therebetween. The first substrate 5 and the second substrate 6 are attached together via a sealing member 4 therebetween.

The first substrate 5 and the second substrate 6 include a first base 5a and a second base 6a, respectively. The first base 5a and the second base 6a are made from a transparent (e.g., glass) flat member and correspond to a member to be bonded. As illustrated in FIG. 2, polarizers 8 and 9 for polarizing incident light are disposed on an outer surface of the first base 5a and that of the second base 6a, respectively.

As illustrated in FIGS. 1 and 2, at an inner side of the first base 5a (i.e., adjacent to the liquid crystal), a plurality of source lines 10 can be arranged in parallel to each other in the y-axis direction and a plurality of gate lines 11 can be arranged in parallel to each other in the x-axis direction. An alignment layer 12 is disposed adjacent to the liquid crystals with respect to the source lines 10 and the gate lines 11. Each of the source lines 10 and the gate lines 11 can be made of nickel and is electrically connected to a TFT (not shown). The TFT is electrically connected to a pixel electrode 13. The pixel electrode 13 can be made of indium tin oxide (ITO).

A first end and a second end of the source line 10 are electrically connected to a source electrode (not shown) of the TFT and an output connection terminal 14, which will be described below, respectively. A first end and a second end of the gate line 11 are electrically connected to a gate electrode (not shown) of the TFT and the output connection terminal 14, respectively.

When a voltage is applied to the gate electrode, a current passes from the source electrode (not shown) to the pixel electrode 13 and vice versa through the source line 10 and the gate line 11. The source electrode is used to apply a data signal to the pixel electrode 13. The pixel electrode 13 and a common electrode are used to apply a voltage to the liquid crystals 7 disposed therebetween.

As illustrated in FIGS. 1 and 2, the first base 5a can include an overhang 15 extending beyond the periphery of the second base 6a. A driver IC 16 for driving the liquid crystals can be implemented on the overhang 15. The source line 10 and the gate line 11 extend on the overhang 15 from an area surrounded by the sealing member 4 and are electrically connected to the respective output connection terminals 14 aligned in an area where the driver IC 16 is implemented.

As illustrated in FIG. 3, the overhang 15 can include a plurality of input leads 17 capable of supplying a current from the flexible substrate 3 to the driver IC 16 on its end adjacent to the flexible substrate 3. The input leads 17 correspond to second leads. The first substrate 5 and the flexible substrate 3 are bonded together with a bonding member therebetween, which will be described below, such that the flexible substrate 3 is bonded to a side end portion of the overhang 15. At this time, an overlapping region C (C in FIG. 3), where the first substrate 5 and the flexible substrate 3 overlap each other, can be substantially rectangular, as illustrated in FIG. 3.

As illustrated in FIGS. 2 and 3, a first end of each of the input leads 17 can be formed as an external terminal 18 electrically connected to a trace pattern of the flexible substrate 3, which corresponds to first leads and will be described below, in the overlapping region C, and a second end of the input lead 17 can be electrically connected to an input connection terminal 19. The input connection terminals 19 are aligned in the area where the driver IC 16 is implemented.

As illustrated in FIG. 2, the driver IC 16 can include a plurality of bumps 20 electrically connected to the output connection terminals 14 and the input connection terminals 19 at its implemented surface, which faces the overhang 15. The bumps 20 can be made of nickel, copper, gold, and other materials and can have a substantially rectangular parallelepiped shape.

As illustrated in FIG. 2, at an inner side of the second base 6a (i.e., adjacent to the liquid crystal), a common electrode 21 is disposed. An alignment layer 22 is disposed adjacent to the liquid crystals with respect to the common electrode 21.

Although not illustrated in the drawings, between the first base 5a and the second base 6a, a background layer, a reflective layer, a color layer, and a light shielding layer can be formed if needed.

As illustrated in FIGS. 1 and 2, in the flexible substrate 3, a trace pattern 24 and a dummy lead 24b can be implemented on a base 23. The trace pattern 24 corresponds to first leads, and the base corresponds to a flexible base. The trace pattern 24 can be made of copper.

The base 23 is a flexible film. As illustrated in FIGS. 3 and 5, the trace pattern 24 and the dummy leads 24b can include connection terminals 25 arranged at an end side 23a of the base 23 of the flexible substrate 3 within the overlapping region C. The end side 23a is adjacent to the overhang 15. As illustrated in FIG. 5, the connection terminals 25 of the trace pattern 24 and also the dummy leads 24b have substantially the same width D (D in FIG. 5) in the overlapping region C.

As illustrated in FIG. 5, the dummy leads 24b can consist of four dummy leads disposed outside an outermost trace 24a on each side portion of the base 23.

As illustrated in FIG. 3, the flexible substrate 3 can have a substantially rectangular strengthening portion 26 outside the overlapping region C (in FIG. 3, below the overlapping region C). The strengthening portion 26 is formed integrally with the dummy leads 24b so as to connect the dummy leads 24b together. In other words, the dummy leads 24b extend from the strengthening portion 26. As illustrated in FIG. 3, the strengthening portion 26 can be next to the outermost trace 24a of the trace pattern 24.

Therefore, as illustrated in FIG. 5, the width E of the strengthening portion 26 can be larger than at least the width D of the dummy lead 24b (the width in the x-axis direction in FIG. 3), i.e., D<E. Four connection terminals 25 formed integrally with the strengthening portion 26 are shaped like the teeth of a comb.

As illustrated in FIGS. 2, 3, and 4, the connection terminals 25 can be electrically connected to the respective external terminals 18 of the liquid crystal panel 2 via an ACF 27. The ACF 27 corresponds to a bonding member. As illustrated in FIG. 4, the size and the position of the strengthening portion 26 can be adjusted such that an outer edge (an end) 27a of the ACF 27 protruding from the overlapping region C toward the outside thereof is positioned on the surface of the strengthening portion 26.

As illustrated in FIGS. 3, 4, and 5, the strengthening portion 26 can have a substantially rectangular shape in plan view. The strengthening portion 26 can be made of the same material (e.g., copper) as that of the trace pattern 24 and the dummy lead 24b such that a side 26a of the strengthening portion 26 adjacent to the first base 5a is substantially in contact with a side 5b of the first base 5a adjacent to the base 23 in plan view. The side 26a of the strengthening portion 26 may be separate from the side 5b of the first base 5a. Also in this case, the outer edge 27a of the ACF 27 may preferably be positioned on the strengthening portion 26.

The shape of the strengthening portion 26 is not limited to a rectangle and can have any shape as long as the strengthening portion 26 is formed by use of the dummy leads 24b, the strengthening portion 26 may preferably be formed such that the outer edge of the ACF 27 is positioned on the strengthening portion 26. The strengthening portion 26 described above is disposed on each of both side portions of the flexible substrate 3. However, the strengthening portion 26 may be disposed on only one side portion, although the advantages are reduced. The strengthening portion 26 described above is formed integrally with the four dummy leads 24b. However, the number of the dummy leads 24b is not limited to four. For example, it may be two, three, five, or more.

In the foregoing description, the substantially rectangular strengthening portion 26 is disposed outside the overlapping region C (in FIG. 3, below the overlapping region C). However, the position of the strengthening portion 26 is not limited to this location. For example, the strengthening portion 26 may be disposed inside the overlapping region C.

Method for Producing Liquid Crystal Device

A method for producing a liquid crystal device (electro-optical device) having the structure above, in particular, bonding of a flexible substrate to a liquid crystal panel will now be briefly described below.

For example, the TFT, the source line 10, the gate line 11, and the pixel electrode 13 are formed at a side of the first base 5a adjacent to the liquid crystals. The alignment layer 12 is formed at a side of these components adjacent to the liquid crystals and is subjected to rubbing. In this way, the first substrate 5 is produced. A background layer, a reflective layer, a color layer, and other layers may be formed at a side of the second base 6a adjacent to the liquid crystals if needed. The common electrode 21 is formed at a side of these layers adjacent to the liquid crystals. The alignment layer 22 is formed and is subjected to rubbing. In this way, the second substrate 6 is produced.

One or more spacers 28 are distributed on the second substrate 6 by, for example, a dry spray method. The first substrate 5 and the second substrate 6 are attached together via the sealing member 4 therebetween. Then, the liquid crystals 7 are injected through an inlet (not shown) of the sealing member 4. The inlet of the sealing member 4 is sealed by an end-sealing material (e.g., ultraviolet curable resin) after the gap is filled with the liquid crystals 7.

The driver IC 16 is pressed by a bonding head (not shown) against the output connection terminal 14 and the input connection terminal 19 with a predetermined pressure via, for example, an ACF, is heated at approximately 300° C., and is thus bonded thereto. Therefore, the driver IC 16 is implemented on the first substrate 5. The polarizer 8 and the polarizer 9 are attached to the outer surface of the first substrate 5 and that of the second substrate 6, respectively. In this way, the production of the liquid crystal panel 2 is completed.

Then, the necessary trace pattern 24, the dummy lead 24b, and the connection terminal 25 are formed and implemented on the base 23. The flexible substrate 3 is thus produced. At this time, the substantially rectangular strengthening portion 26 is formed substantially simultaneously with the formation of other leads so as to connect the dummy leads 24b.

The connection terminal 25 for the trace pattern 24 of the flexible substrate 3 is electrically connected to the external terminal 18 of the liquid crystal panel 2 via the ACF 27 therebetween, thus forming the overlapping region C. At this time, as illustrated in FIG. 4, the ACF 27 may leak between the first substrate 5 and the flexible substrate 3 and protrude from the overlapping region C by F (F in FIG. 4). In this case, the protruded outer edge 27a is cured and lies on the strengthening portion 26.

An illumination unit (e.g. a backlight) may be mounted if needed. Then, the production of the liquid crystal device 1 is completed. The description of a method for producing the liquid crystal device 1 is completed.

According to the present embodiment, the strengthening portion 26 is not provided in the overlapping region C, and the connection terminals 25 of the flexible substrate 3 electrically connected to the external terminals 18 of the liquid crystal panel 2 have substantially the same width. As a result, conditions, such as voltages thereon, can be uniform, so reliability of connection can be improved.

As described above, the four dummy leads 24b are disposed, for example, outside the outermost trace 24a, and the strengthening portion 26 has the width E larger than the width D of the outermost trace 24a. Therefore, the trace pattern 24 can withstand a stress caused by, for example, the flexible substrate 3 being bent with respect to the liquid crystal panel 2. As a result, electrical reliability of the liquid crystal device 1 can be improved.

Since the strengthening portion 26 is disposed on each of both side portions of the flexible substrate 3, even when the both side portions are subjected to a stress, a break occurring in the trace pattern 24 can be reliably reduced. As a result, electrical reliability of the liquid crystal device 1 can be further improved.

Since at least a section of the outer edge of the ACF 27 is positioned on the strengthening portion 26, a portion subjected to the highest stress can be efficiently reinforced. As a result, electrical reliability of the liquid crystal device 1 can be still further improved.

Since the strengthening portion 26 is made of the same material as that of the other leads (e.g., copper), the strengthening portion 26 can be formed substantially simultaneously with the formation of the trace pattern 24 on the base 23. This can simplify the manufacturing process, and thus the cost of manufacturing can be reduced.

Since the strengthening portion 26 has a substantially rectangular shape in plan view and the side 26a of the strengthening portion 26 adjacent to the first base 5a is substantially in contact with the side 5b of the first base 5a adjacent to the base 23 in plan view, even if the amount of the protruded portion of the ACF 27 is small, the outer edge 27a of the ACF 27 can be reliably disposed on the strengthening portion 26. Therefore, a break occurring in the trace pattern 24 caused by a stress occurring in the ACF 27 can be reliably reduced.

Second Embodiment

A second embodiment of the invention will now be described below. The present embodiment is different from the first embodiment in that a strengthening portion is not formed by use of a dummy lead, but is formed independently. The following description focuses on this difference. Components in the present embodiment common to the first embodiment have the same reference numerals, and the description thereof is omitted.

Figure 6:
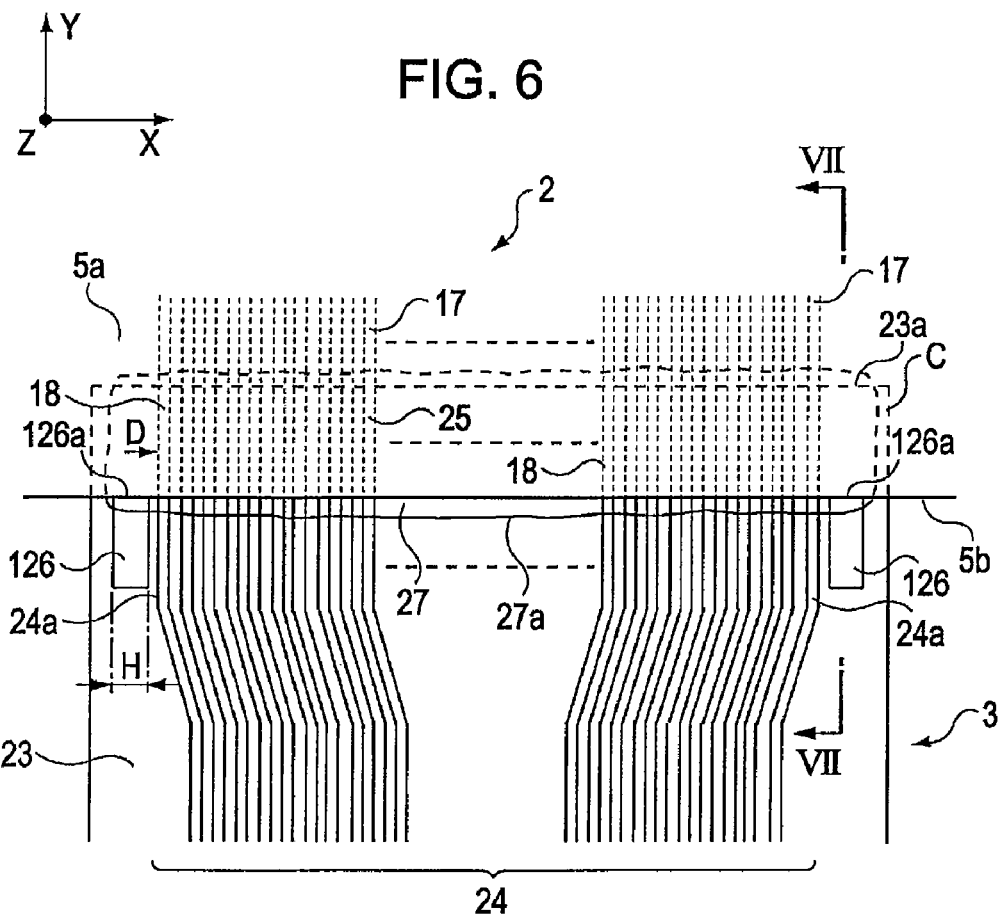
FIG. 6 illustrates a strengthening portion in the vicinity of an overlapping region according to a second embodiment.
Figure 7:
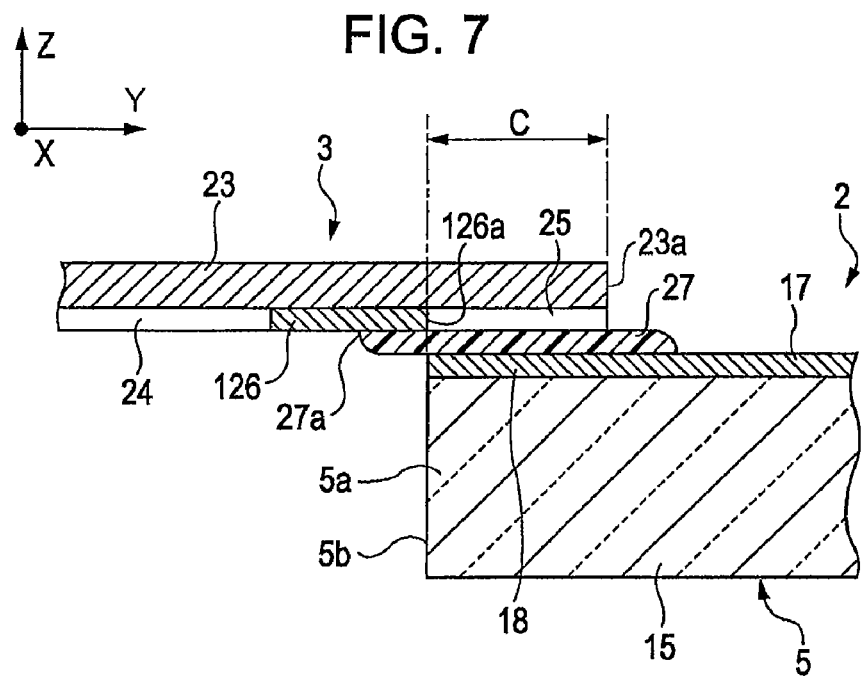
FIG. 7 is a cross-sectional view taken along the line VII-VII of FIG. 6 according to the second embodiment.

FIG. 6 illustrates a strengthening portion in the vicinity of an overlapping region according to the second embodiment. FIG. 7 is a cross-sectional view taken along the line VII-VII of FIG. 6.

Structure of Liquid Crystal Device

As illustrated in FIGS. 6 and 7, the flexible substrate 3 can include the base 23, the trace pattern 24, and a strengthening portion 126. The trace pattern 24 and the strengthening portion 126 are formed and implemented on the base 23. The trace pattern 24 can be made of copper. The base 23 corresponds to a flexible base. The trace pattern 24 corresponds to first leads.

As illustrated in FIG. 6, the strengthening portion 126 can have a substantially rectangular shape in plan view and can be disposed outside the overlapping region C (in FIG. 6, below the overlapping region C) and outside each of both the outermost traces 24a (in FIG. 6, in the x-axis direction). As illustrated in FIG. 6, the strengthening portion 126 can have the width H larger than the width D of the outermost trace 24a (in FIG. 6, the width in the x-axis direction), i.e., D<H. Therefore, even if the trace pattern 24 is subjected to a stress that may cause a crack occurring in the trace pattern 24, the strengthening portion 126 can reduce a break occurring in the trace pattern 24, which is disposed inside the strengthening portion 126.

As illustrated in FIG. 7, the size and the position of the strengthening portion 126 can be adjusted such that the outer edge (the end) 27a of the ACF 27 protruding from the overlapping region C to the outside thereof is positioned on the surface of the strengthening portion 126.

As illustrated in FIGS. 6 and 7, the strengthening portion 126 can be made of the same material (e.g., copper) as that of the trace pattern 24 so that a side 126a of the strengthening portion 126 adjacent to the first base 5a is substantially in contact with the side 5b of the first base 5a adjacent to the base 23 in plan view.

The shape of the strengthening portion 126 is not limited to a rectangle. The outer edge 27a of the ACF 27 may preferably be positioned on the strengthening portion 126. The strengthening portion 126 described above is disposed on each of both side portions of the flexible substrate 3. However, the strengthening portion 126 may be disposed on only one side portion, although the advantages are reduced. The number of strengthening portions 126 on one side portion is not limited to one. For example, two or more strengthening portions 126 may be arranged thereon. In this case, the strengthening portions 126 may have different shapes.

Each of the strengthening portions 126 described above is disposed outside the overlapping region C (in FIG. 6, below the overlapping region C). However, the position of the strengthening portion 126 is not limited to this. For example, the strengthening portion 126 may be disposed inside the overlapping region C.

Method for Producing Liquid Crystal Device

A method for producing a liquid crystal device (electro-optical device) having the structure above is substantially the same as that in the first embodiment, for example, in that the strengthening portion 126 is formed substantially simultaneously with the formation of the trace pattern 24, except that the strengthening portion 126 is not formed integrally with a dummy lead but is formed independently. Therefore, the description thereof is omitted.

According to the present embodiment, since the overlapping region C and the strengthening portion 126 having the width H larger than the width D of the outermost trace of the trace pattern 24 are provided, even if it is difficult to have a dummy lead outside the trace pattern 24, for example, a crack or a break occurring in the trace pattern 24 resulting from a stress cause by bending of the base 23 can be reduced. This can improve electrical reliability of the liquid crystal device 1. It is, of course, possible to have both the strengthening portion 126 and the strengthening portion 26, which uses the dummy leads 24b.

Third Embodiment

Electronic Apparatus

An electronic apparatus including the liquid crystal device 1 described above according to a third embodiment of the invention will now be described below.

Figure 8:
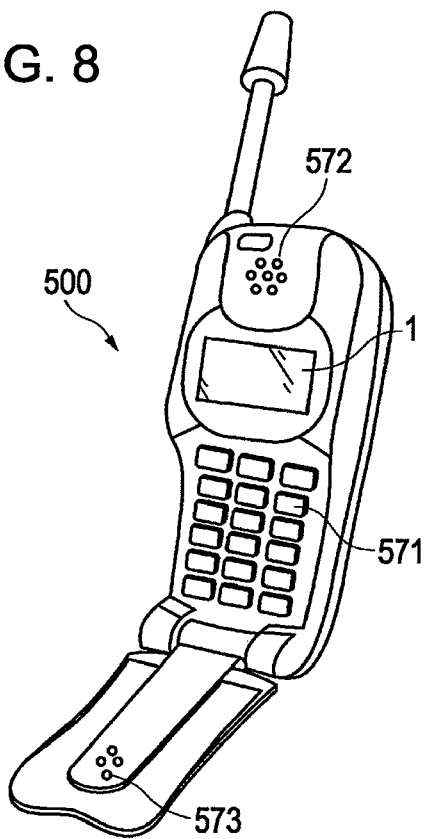
FIG. 8 is an external perspective view of a cellular phone according to a third embodiment.
Figure 9:
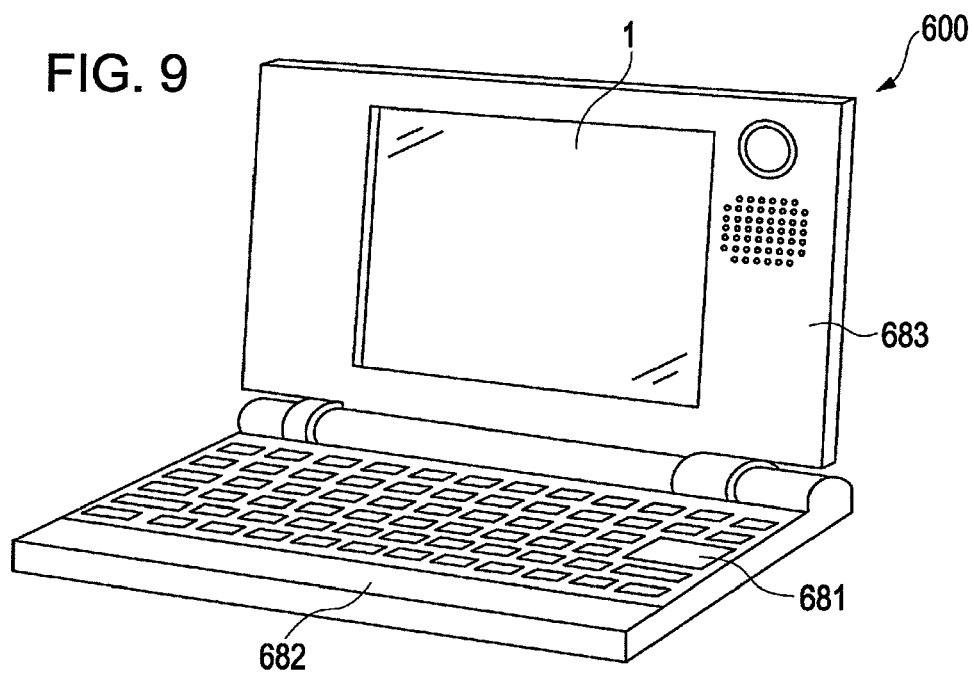
FIG. 9 is an external perspective view of a personal computer according to the third embodiment.

FIG. 8 is an external perspective view of a cellular phone according to the third embodiment. FIG. 9 is an external perspective view of a personal computer according to the third embodiment.

As illustrated in FIG. 8, a cellular phone 500 can include the liquid crystal device 1 on an outer frame having an earpiece 572 and a mouthpiece 573, in addition to a plurality of operating buttons 571.

As illustrated in FIG. 9, a personal computer 600 can include a main body 682 having a keyboard 681 and a liquid crystal display unit 683. The liquid crystal display unit 683 can include the liquid crystal device 1 on its outer frame.

Although not illustrated, each of these electronic apparatuses includes a display-signal generating unit having a display-data output source, various circuits (e.g., a display-data processing circuit), and a power supply circuit for supplying power to these circuits, in addition to the liquid crystal device 1.

For the personal computer 600, the liquid crystal device 1 displays a display image by receiving a display signal generated by the display-signal generating unit in response to information input from the keyboard 681.

According to the present embodiment, the liquid crystal device 1 can ensure reliability of connection of leads between, for example, the liquid crystal panel 2 and the flexible substrate 3 and also reduce a break occurring in the leads and thus improve electrical reliability. Therefore, an electronic apparatus with high reliability can be attained at low cost.

In particular, a portable electronic apparatus, as described above, requires certain electrical reliability that enables the portable electronic apparatus to withstand a shock both during manufacturing and in actual use. Therefore, the invention has great significance in that such electrical reliability can be attained at low cost.

Other examples of the electronic apparatus include a touch panel, a projector, a liquid crystal television, a view-finder or direct-view-monitor video tape recorder, a camcorder, a car navigation system, a pager, an electronic notepad, and a calculator, all of which incorporates a liquid crystal device. The liquid crystal device 1 is applicable to a display unit of these various electronic apparatuses.

The invention is not limited to the embodiments described above. Any variations and modifications can be made within the technical idea of the invention. The described embodiments can be combined without departing from the scope of the invention.

In the embodiments described above, a TFT active-matrix liquid crystal device is used as one example of the liquid crystal device. However, the invention is not limited to this type. For example, a thin-film diode active-matrix liquid crystal device or a passive-matrix liquid crystal device may be used. Therefore, according to the invention, various kinds of liquid crystal devices can ensure reliability of connection of leads between, for example, a liquid crystal panel and a flexible substrate and also reduce a break occurring in the leads and thus improve electrical reliability.

In the foregoing description, the driver IC 16 is implemented by chip on glass (COG). However, the invention is not limited to this process. For example, the driver IC 16 may be implemented on the flexible substrate 3 by chip on film (COF). Therefore, according to the invention, various kinds of liquid crystal devices can ensure reliability of connection of leads between, for example, a liquid crystal panel and a flexible substrate and also reduce a break occurring in the leads and thus improve electrical reliability.

In the foregoing description, each of the strengthening portion 26 and the strengthening portion 126 is disposed on each edge of both side portions of the base 23 bonded to the overhang 15, on which the driver IC 16 is implemented, of the first base 5a. However, the invention is not limited to this structure. For example, as illustrated in FIG. 10, the strengthening portion may be disposed on each end of both side portions (in the x-axis direction in FIG. 10) of a flexible substrate 203 connected to the liquid crystal panel 2 and a liquid crystal panel 202.

FIG. 10 is a schematic perspective view of a flexible substrate that connects two liquid crystal panels.

For example, a strengthening portion 226 can be disposed on each of both side portions of the flexible substrate 203 adjacent to the liquid crystal panel 2 outside an overlapping region where the first base 5a and a base of the flexible substrate 203 by use of dummy leads or independently. Similarly, the strengthening portion 226 can be disposed on each of both side portions of the flexible substrate 3 adjacent to the liquid crystal panel 202. The strengthening portion 226 can be disposed on only one side portion. In this case, it is preferable that at least the connection terminals adjacent to the base has substantially the same width and that the position and the size of the strengthening portion 226 be determined such that the outer edge 27a of the ACF 27 is positioned on the strengthening portion 226.

Therefore, with respect to electrical connection between various kinds of substrates and bases, reliability of connection of leads can be ensured, and a break occurring in the leads can be reduced and thus electrical reliability can be improved.

What is claimed is:

1. A mounting structure comprising:
    a bonded device;
    a flexible base, including a plurality of first leads extending in a y-direction;
    a reinforcing portion arranged on the flexible base between a side edge of the flexible base and an outer lead of the plurality of first leads, the reinforcing portion having a width in an x-direction larger than a width of the outer lead and extending in the y-direction beyond an edge of the bonded device;
    a bonding member that bonds the bonded device and the flexible base together; and
    wherein the reinforcing portion has a substantially rectangular shape and is formed integrally with a plurality of dummy leads so as to connect the dummy leads together, the dummy leads extending from the reinforcing position in the y-direction in line with the plurality of first leads.

2. The mounting structure according to claim 1,
    wherein the bonded device includes a plurality of second leads electrically connected to the plurality of first leads in a region overlapping the flexible base, and the reinforcing portion includes at least one dummy lead extending therefrom in the y-direction, the dummy lead being electrically connected to the second leads.

3. The mounting structure according to claim 1, wherein a first side of the reinforcing portion is substantially in contact with a first side of the bonded device in plan view, the first side of the reinforcing portion being adjacent to the bonded device, the first side of the bonded device being adjacent to the flexible base.

4. The mounting structure according to claim 1, wherein the reinforcing portion is disposed on each of both side portions of the flexible base.

5. The mounting structure according to claim 1, wherein at least a section of the bonding member is disposed on the reinforcing portion.

6. An electro-optical device comprising:
   an electro-optical panel including a first base and a second base holding an electro-optical material therebetween;
   a flexible base including a plurality of first leads, the flexible base bonded to the first base in a region overlapping an edge of the first base;
   a reinforcing portion arranged on the flexible base between a side edge of the flexible base an x-direction and an outer lead of the plurality of first leads, the reinforcing portion having a width in the x-direction larger than a width of the outer lead and extending in a y-direction beyond the region overlapping the edge of the first base;
   a bonding member that bonds the first base and the flexible base together; and
   wherein the reinforcing portion has a substantially rectangular shape and is formed integrally with a plurality of dummy leads so as to connect the dummy leads together, the dummy leads extending from the reinforcing position in the y-direction in line with the plurality of first leads.

7. The electro-optical device according to claim 6, wherein the first base includes a plurality of second leads electrically connected to the plurality of first leads in the region overlapping the edge of the first base, and
   the reinforcing portion having at least one dummy lead extending therefrom, the dummy lead being electrically connected to one of the second leads.

8. The electro-optical device according to claim 6, wherein a first side of the reinforcing portion is substantially in contact with a first side of the first base in plan view, the first side of the reinforcing portion being adjacent to the first base, the first side of the first base being adjacent to the flexible base.

9. An electronic apparatus comprising an electro-optical device comprising:
   an electro-optical panel including a first base and a second base holding an electro-optical material therebetween;
   a flexible base including a plurality of first leads, the flexible base bonded to the first base in a region overlapping an edge of the first base;
   a reinforcing portion arranged on the flexible base between a side edge of the flexible base in an x-direction and an outer lead of the plurality of first leads, the reinforcing portion having a width in the x-direction larger than a width of the outer lead and extending in a y-direction beyond the region overlapping the edge of the first base;
   a bonding member that bonds the first base and the flexible base together;
   wherein the reinforcing portion has a substantially rectangular shape and is formed integrally with a plurality of dummy leads so as to connect the dummy leads together, the dummy leads extending from the reinforcing position in the y-direction in line with the plurality of first leads.

10. The electronic apparatus according to claim 9, wherein the first base includes a plurality of second leads electrically connected to the plurality of first leads in the region overlapping the edge of the first base, and
    the reinforcing portion including at least one dummy lead extending therefrom, the dummy lead being electrically connected to one of the second leads.

11. The electronic apparatus according to claim 9, wherein a first side of the reinforcing portion is substantially in contact with a first side of the first base in plan view, the first side of the reinforcing portion being adjacent to the first base, the first side of the first base being adjacent to the flexible base.

* * * * *